United States Patent [19]

Barron, Jr. et al.

[11] Patent Number: 5,410,148

[45] Date of Patent: Apr. 25, 1995

[54] SAFETY SWITCH SYSTEM WITH PHOTOOPTICAL AND CAPACITANCE DETECTION

[75] Inventors: Kenneth L. Barron, Jr., St. Charles; Tan-Cheng Chou, Arlington Heights; Staton Williams, Bloomingdale; Darrin Kohn, Carol Stream, all of Ill.

[73] Assignee: KES Corporation, St. Charles, Ill.

[21] Appl. No.: 62,010

[22] Filed: May 14, 1993

[51] Int. Cl.⁶ .............................................. G01V 9/04
[52] U.S. Cl. ..................................... 250/221; 361/181
[58] Field of Search ...................... 250/221, 222.1, 229, 250/214 R; 361/181, 189

[56] References Cited

U.S. PATENT DOCUMENTS 4,703,573  11/1987  Montgomery et al. ................ 40/455
4,878,107  10/1989  Hopper .............................. 250/221
4,939,358   7/1990  Herman et al. ...................... 250/221

Primary Examiner—David C. Nelms
Attorney, Agent, or Firm—Douglas B. White

[57] ABSTRACT

A switch system for an industrial machine is described which combines both optical and capacitance switches in a switch assembly. A photo-optical switch is positioned in each assembly to provide an output signal upon the introduction of a human hand into an opening formed therein, and a capacitance sensitive touch plate switch is positioned within the opening to provide an output signal upon contact by a human hand. Circuitry responds to the substantially simultaneous activation of both the optical and capacitance switches within the switch assembly and produces an output signal. Typically two of such switch assemblies are used to control power to an industrial machine.

11 Claims, 4 Drawing Sheets

5,410,148

SAFETY SWITCH SYSTEM WITH PHOTOOPTICAL AND CAPACITANCE DETECTION

BACKGROUND OF THE INVENTION

1. Field of the Invention

This invention relates generally to switches and more particularly to switch systems used to control power to an industrial machine.

2. Description of the Prior Art

Previously switch systems used to control industrial machines have employed either optical switches or capacitance touch plate switches. An example of an optical switch system is disclosed in U.S. Pat. No. 4,939,358, and an example of a touch plate system is disclosed in U.S. Pat. No. 4,412,268. However, these systems can be triggered unintentionally and no system presented to date has improved on the safety of these switch systems. Typical causes of false triggering of the optical switch are an operator's sleeve, insects or dust; and external RF disturbances can affect the touch plate capacitance switch. Also, in spite of safety precautions, some operators will attempt to trick the switches by placing an object in the switch opening to trip the optical switch or will use a capacitive device to trip the touch plate switch.

SUMMARY OF THE INVENTION

It is accordingly a principal objective of the present invention to provide a switch system for an industrial machine which improves on the safety of prior systems. This objective is achieved by combining both optical and capacitance switches together in a switch assembly, two of which are typically coupled together to control power to an industrial machine. Each switch assembly has an opening dimensioned to allow the introduction of a human hand, a photo-optical switch positioned in each switch assembly to provide an output signal upon the introduction of the human hand, and a capacitance sensitive touch plate switch positioned within the opening in each switch assembly to provide an output signal upon contact by the human hand. Circuitry detects the substantially simultaneous activation of both the optical and capacitance switches within the switch assemblies, and produces an output signal used to control power to an industrial machine.

While the invention will be described in connection with a preferred embodiment, it will be understood that it is not the intent to limit the invention to that embodiment. On the contrary, it is the intent to cover all alternatives, modifications, and equivalents as may be included within the spirit and scope of the invention as defined by the appended claims.

DESCRIPTION OF THE PREFERRED EMBODIMENT

Figure 1:
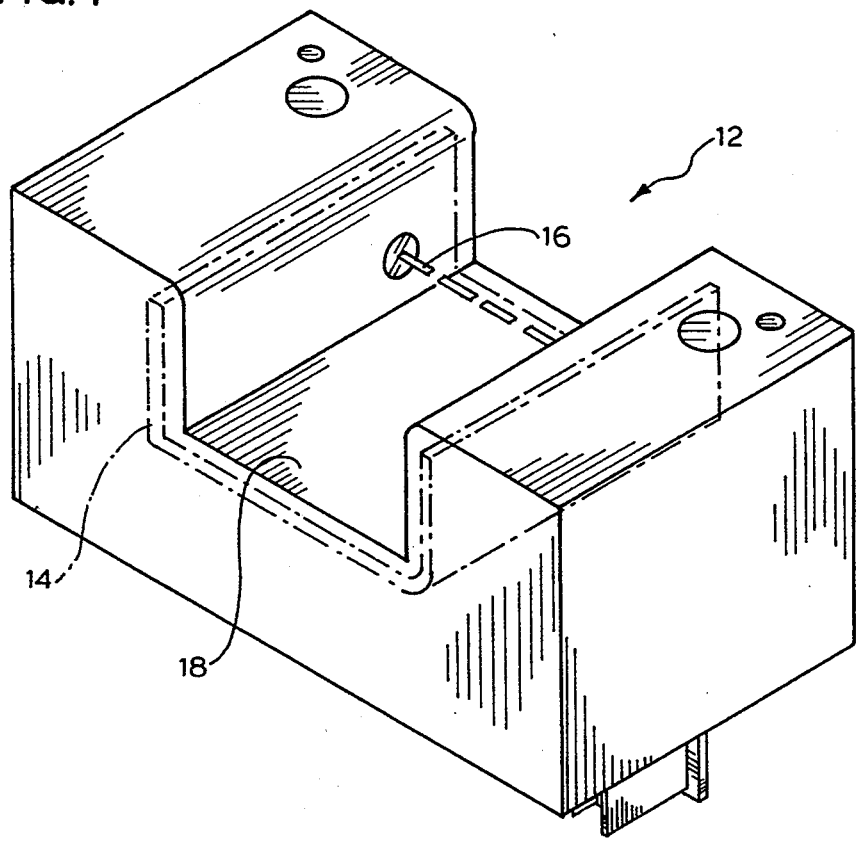
FIG. 1 is a perspective view of a switch assembly used with the switch system of the present invention.

The safety switch system of the present invention comprises hand operated switch assemblies of the type shown in FIG. 1, wherein each switch assembly includes a "U" shaped opening 12 dimensioned to accept the entry of a human hand. Typically, two switch assemblies are coupled together in a machine control system, in a manner well known in the art, such that machine control requires actuation of both switch assemblies. In each switch assembly a capacitive plate 14 underlies the "U" shaped opening, and a light beam 16 is passed across the opening. With the circuitry described hereinafter, the entry of a human hand into the opening breaks the light beam to actuate a photo-optical switch, and contact by the hand with the housing 18 (or the close proximity of the hand) actuates a touch plate capacitance sensitive switch.

Figure 2:
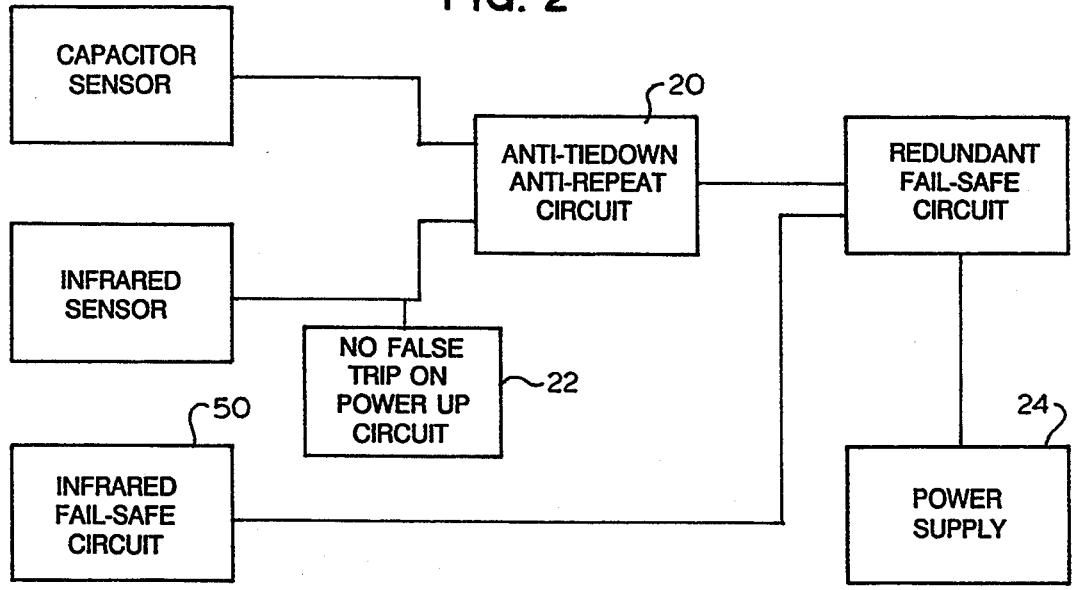
FIG. 2 is a block diagram of the circuitry of the switch system of the present invention.

As generally depicted in the block diagram of FIG. 2, the capacitor sensor and the optical (infrared) sensor in a switch assembly are interlocked with anti-tiedown and anti-repeat circuitry 20. This coupling requires that both sensors in a switch assembly be triggered within a preset time interval and that the trigger be maintained throughout that interval for that switch assembly to be activated. If any of these conditions are not met, the switch assembly does not activate; and the circuitry waits until both sensor switches are in an untriggered state before it can be reactivated. Activation of this switch assembly is therefore only possible when an object, large enough to break the infrared beam and with enough electrically conductive mass to actuate the touch plate switch, is inserted into the switch opening 12 and pressed against (or positioned close to) the housing surface 18.

Figure 3:
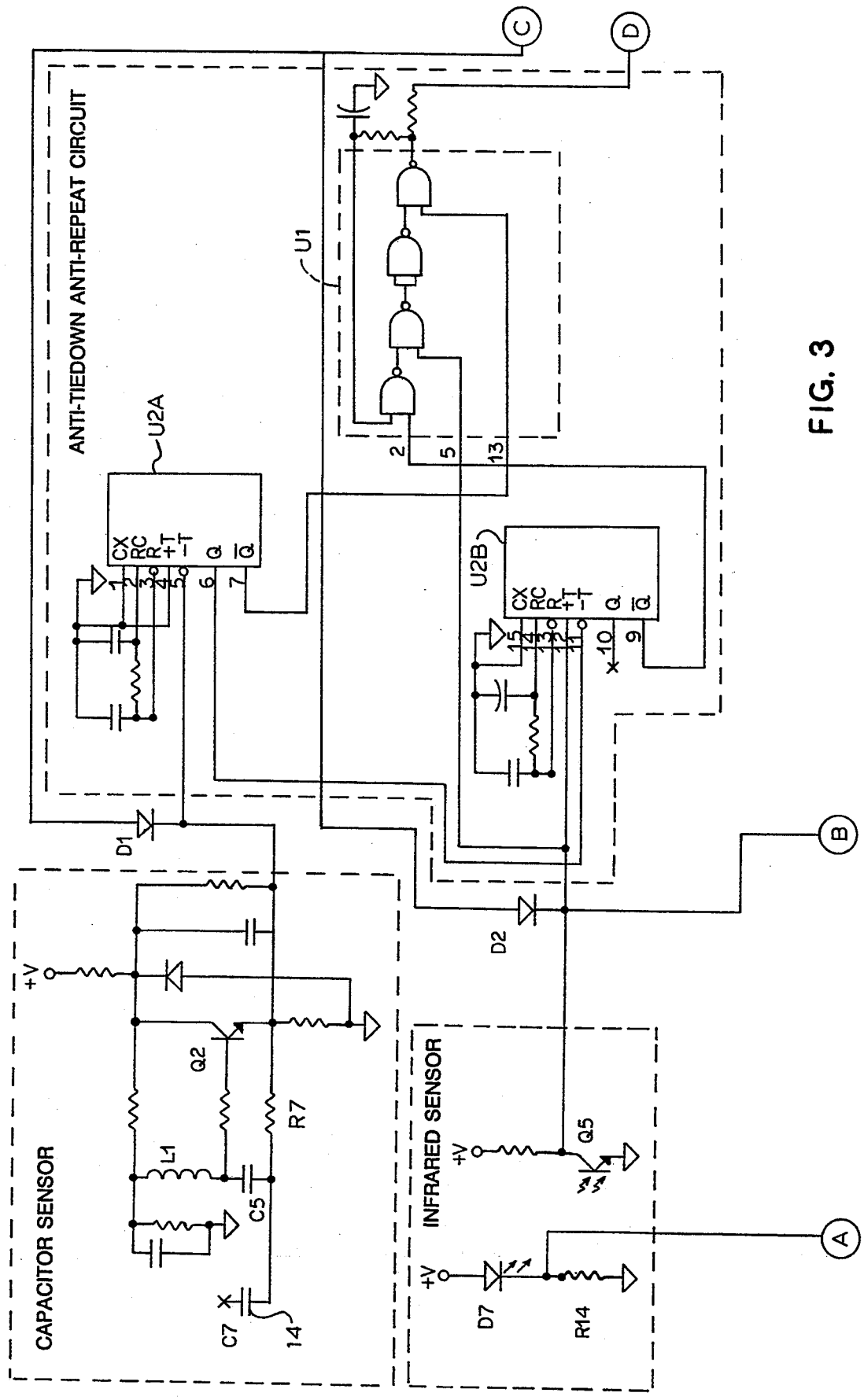
FIG. 3 is a schematic of the switch sensors and the interlocking circuitry.

Turning now to the schematic diagram of the circuitry, FIG. 3 depicts the capacitance sensor, the infrared sensor, and the interlocking anti-tiedown and anti-repeat circuitry. The capacitance sensor contains a parallel L-C circuit (inductor L1 and capacitor C7) at the base of transistor Q2. The L-C circuit has positive feed back from the emitter of Q2 via resistor R7 and capacitor C5. The capacitor C7 of the L-C circuit is a sensor capacitor with one plate 14 of the capacitor connected to the point between resistor R7 and capacitor C5. This capacitor plate 14 is the U-shaped metal plate surrounding the bottom and the two walls of the opening 12 in the switch assembly forming the sensor channel. Operation of the L-C circuit generates an output at the collector of transistor Q2 which oscillates between 1.2 Volts and 5.8 Volts, at a frequency around 400 kHz. But the oscillation is stopped and a voltage of 3.5 appears whenever a human hand is placed in close proximity to the capacitor plate 14.

The infrared sensor generates a light beam at an infrared wavelength with the infrared LED D7 and receives the beam with phototransistor Q5. The output from the collector of Q5 is 1 volt when the infrared beam is not blocked and 4.3 volt when the infrared beam is blocked.

The interlocking anti-tiedown/anti-repeat circuit contains two monostable multivibrators (U2A and U2B) and a quad 2-input NAND gate (U1), the operation of which will be apparent from the following examples.

When the capacitance sensor is untriggered the output pin 6 of U2A will hold at 5 volts and the output pin 7 of U2A will hold at 0 volt. This state will continue as long as input pin 4 of U2A is held to 0 and input pin 5 of U2A is receiving oscillations. However, when input pin 11 of U2B is held at 5 volts (capacitance sensor untriggered) and then input pin 12 of U2B receives the rising edge of the output from the infrared sensor (infrared sensor triggered), or if pin 12 of U2B is held at 0 volts (infrared sensor untriggered) and then pin 11 of U2B receives the falling edge from the output of U2A (capacitance sensor triggered), then the U2B output, pin 9, will send a pulse to input pin 2 of the NAND gate logic circuit U1. This corresponds, respectively, to a triggering of the infrared sensor without prior triggering of the capacitance sensor, and the triggering of the capacitance sensor without prior triggering of the infrared sensor.

In other words, if the infrared beam is blocked (4.3 volts is transmitted to pin 12 of U2B) while the capacitor sensor is untriggered (pin 5 of U2A is still receiving oscillations and so output pin 6 of U2A, which is connected to pin 11 of U2B, is still at 5 volts), then U2B detects the 0 to 4.3 volts change from the infrared sensor at pin 12 and sends a pulse to pin 2 of the NAND gates (U1). And if the capacitor sensor is triggered (pin 5 of U2A receives no oscillation and output pin 6 of U2A, which is connected to pin 11 of U2B, switches from 5 volts to 0 volts) while the infrared sensor is not blocked (a 0 volt is transmitted to pin 12 of U2B), then U2B receives the 5 to 0 volt change at pin 11 and sends a pulse to pin 2 of the NAND gates (U1).

Figure 5:
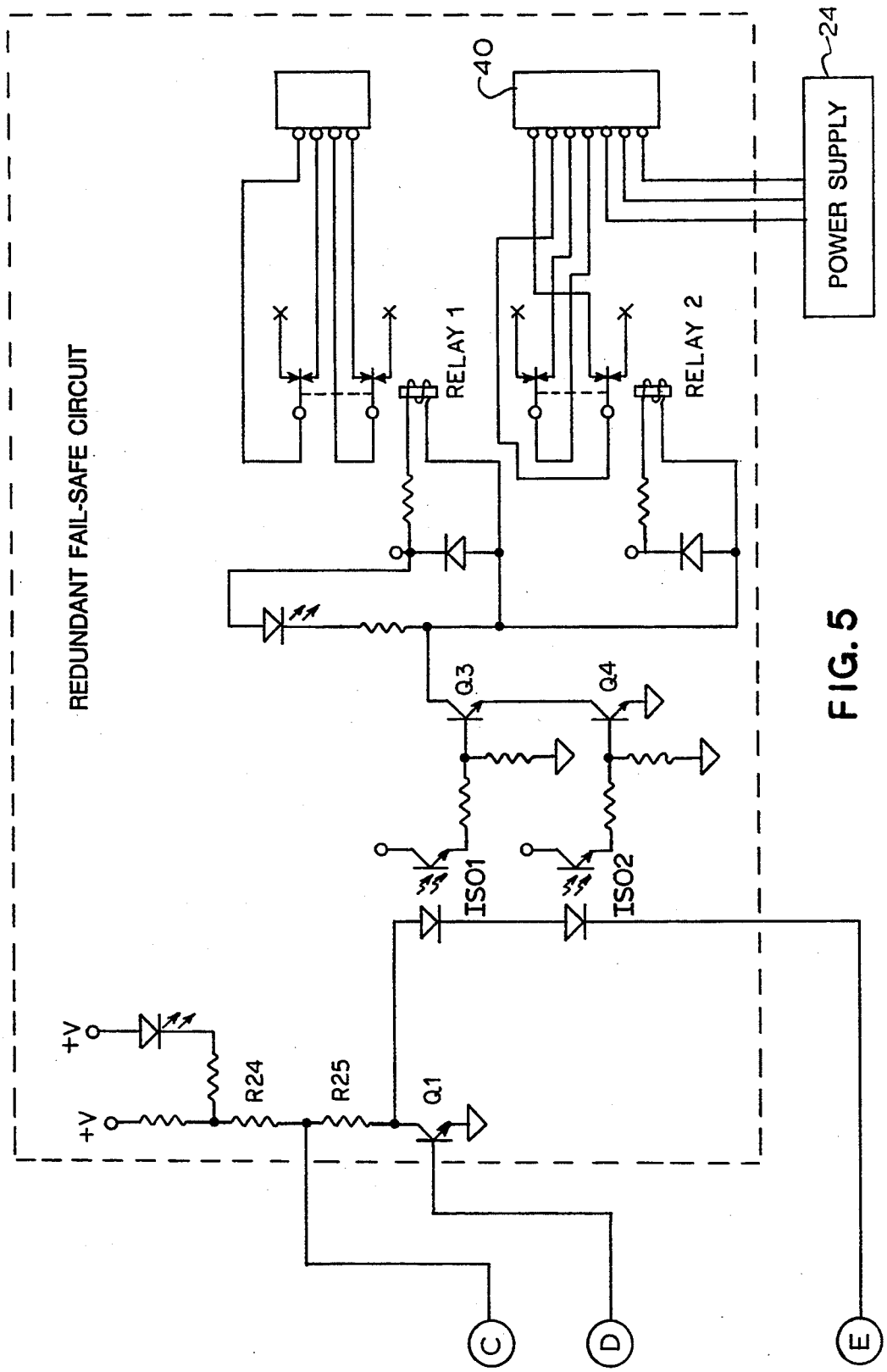
FIG. 5 is a schematic of the redundant fail-safe circuitry of the invention.

It is therefore apparent from the above that the NAND gate logic detects the first triggering event on pin 2, and given the pulse duration established by the multivibrators before the pulse to pin 2 of U1 terminates, a preset time period is established during which both capacitance and optical sensors must be triggered. The triggering of the second sensor in succession is then logically input at pin 5 (infrared sensor) and pin 13 (capacitance sensor) of the NAND gates. Accordingly, the second sensor must be triggered within the preset pulse duration input to pin 2 to achieve an output from the NAND gates (U1). This NAND gate output causes the current which previously was flowing through the transistor Q1 (see FIG. 5) to now flow through the diodes of ISO1 and ISO2, turning on the transistors in ISO1 and ISO2.

ISO1 and ISO2 are two infrared optical couplers which provide the base current for transistors Q3 and Q4. Transistors Q3 and Q4 are the drivers for the relays RELAY1 and RELAY2. (The diodes in ISO1 and ISO2 and the transistor drivers Q3 and Q4 are chained together so that a single failure of any one of these components will deactivate the relays.) When the driver transistors Q3 and Q4 are switched on, RELAY1 and RELAY2 are actuated and contact closures are provided. Power from the power supply 24 is provided to connector terminal 40 where it is connected for relay switched control of the industrial machine in accordance with methods well known in the art.

Additional control of the relay contacts are provided by two diodes, D1 and D2 (FIG. 3), connected to the point between resistors R24 and R25 (FIG. 5) to provide feedback to both multivibrator inputs. When transistor Q1 turns off, the voltage between the resistors R24 and R25 changes from 1.4 volts to 3 volts; and this 3 volt signal is sufficiently high, in conjunction with these diodes, for the circuit to avoid oscillation and thus to prevent the relays from chattering.

Figure 4:
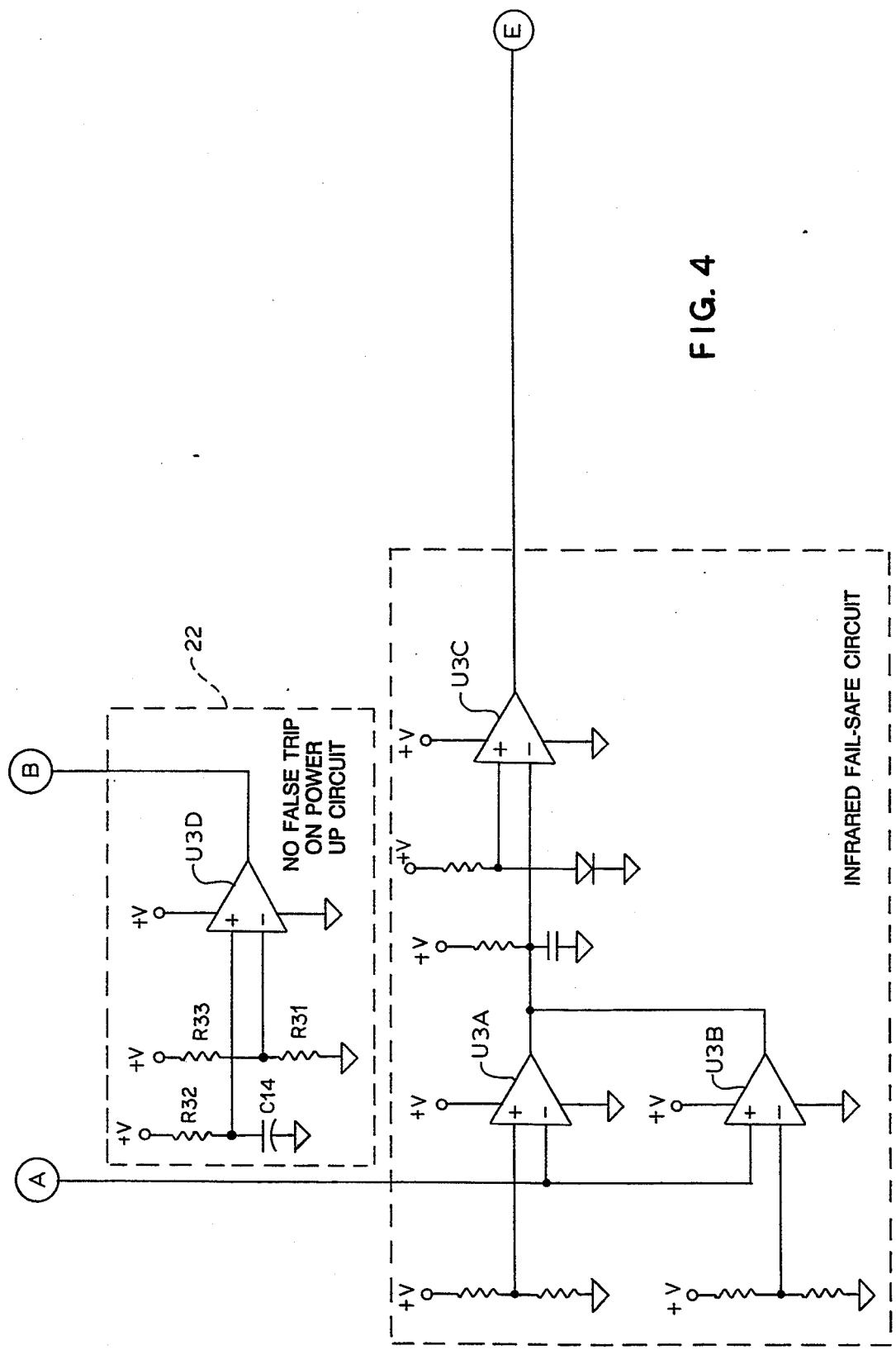
FIG. 4 is a schematic of additional safety circuitry.

In an additional feature of this system, circuitry 22 (FIG. 4) prevents a false trigger during power-up. When power is applied to the switch assembly, circuitry 22 holds the output of the infrared sensor at 0 volts for a preset period (which is longer than the preset duration of the pulse from pin 9 of the multivibrator U2B) to prevent the interpretation of a valid trigger of the infrared sensor until power-up is complete. To achieve this hold signal, a comparator U3D is set to provide a delayed switch from 0.2 volts to 1 volt. This is accomplished by providing 4.5 volts to the negative input of comparator U3D, and charging capacitor C14 through resistor R32 to supply an increasing voltage to the positive input of the comparator at start-up. When the charge of capacitor C14 reaches the 4.5 volts limit, the output of U3D switches high to enable the infrared sensor circuit.

In another feature of this invention, a dedicated infrared fail-safe circuit will detect infrared LED failure. The most common failure mode is for this device to stop conducting or "open". Since this type of failure could be interpreted as a blocked beam, it must be monitored to prevent a false trigger. The infrared fail-safe circuit monitors the LED by checking the operating voltage level in the infrared beam circuit and detecting whether it falls within a window of allowable voltages. When the infrared LED is functioning properly, the junction between diode D7 and resistor R14 (FIG. 3) will operate at about 3.8 volts. When the infrared LED is either burned open or is short circuited the voltage at that junction point will be either 0 volts or 5 volts respectively. To monitor this operation a defined window of 2.5 volts to 4.5 volts is set up by two comparators U3A and U3B (FIG. 4) using voltage dividers at the input to each comparator. The output available at the output of comparator U3C is at 0 volts during normal operation, but will switch to 5 volts when the infrared LED fails. When this output switches to the 5 volt level the optical couplers ISO1 and ISO2 (FIG. 5) are disabled.

From the foregoing description, it will be apparent that modifications can be made to the apparatus and method for using same without departing from the teachings of the present invention. Accordingly, the scope of the invention is only to be limited as necessitated by the accompanying claims.

What is claimed is:

1. A safety switch system for controlling power to an industrial machine, comprising:
a switch housing presenting an opening dimensioned to allow the introduction of a human hand into said opening, a photo-optical switch positioned in said housing to provide an output signal upon the introduction of a human hand into said opening, and a capacitance sensitive touch plate switch positioned within said opening in said housing to provide an output signal upon contact by a human hand; and
detection circuitry for detecting the activation of both of said photo-optical and capacitance switches during a preset time interval and for producing an output signal in response thereto for controlling power to an industrial machine.

2. The safety switch system for controlling power to an industrial machine of claim 1 wherein said detection circuitry comprises means for detection of the first activation of either said photo-optical switch or said capacitance switch, means for measuring a preset time interval following detection of said first activation, and further comprising means for detecting the subsequent activation of the remaining switch and for providing said output signal when said second switch activation occurs within said time interval.

3. The safety switch system for controlling power to an industrial machine of claim 2 wherein said means for measuring a preset time interval includes a multivibrator electronic device.

4. The safety switch system for controlling power to an industrial machine of claim 3 further comprising NAND gate logic for detecting the occurrences of said activations of said switches and of said time interval.

5. The safety switch system for controlling power to an industrial machine of claim 1 further comprising relay means responsive to said output signal of said detection circuitry for controlling said power to an industrial machine.

6. The safety switch system for controlling power to an industrial machine of claim 5 wherein said relay means is coupled to be driven in response to said detection circuitry output signal by a plurality of transistor devices interconnected to prevent operation of said relay means upon the failure of any one of said transistor devices.

7. The safety switch system for controlling power to an industrial machine of claim 6 wherein each of said transistor devices is coupled to said detection circuitry by optical couplers.

8. The safety switch system for controlling power to an industrial machine of claim 1 further comprising circuit means for affecting the output of said photo-optical switch to prevent detection of activation of said switch during power-up.

9. The safety switch system for controlling power to an industrial machine of claim 8 wherein said circuit means for affecting the output of said photo-optical switch comprises a voltage sensitive switch device coupled to a resistive/capacitive charging circuit.

10. The safety switch system for controlling power to an industrial machine of claim 1 further comprising circuit means for detecting failure of said photo-optical switch, said circuit means including comparator means for detecting operating voltages and for disabling said output signal of said detection circuitry when said operating voltages are unacceptable.

11. The safety switch system for controlling power to an industrial machine of claim 7 further comprising circuit means for detecting failure of said photo-optical switch, said circuit means including comparator means for detecting operating voltage and for disabling said optical couplers when said operating voltages are unacceptable.

* * * * *